(12) United States Patent
Regnier et al.

(10) Patent No.: US 9,666,484 B2
(45) Date of Patent: May 30, 2017

(54) INTEGRATED CIRCUIT PROTECTED FROM SHORT CIRCUITS CAUSED BY SILICIDE

(71) Applicant: STMicroelectronics (Rousset) SAS, Rousset (FR)

(72) Inventors: Arnaud Regnier, Les Taillades (FR); Stephan Niel, Greasque (FR); Francesco La Rosa, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/806,432

(22) Filed: Jul. 22, 2015

(65) Prior Publication Data

US 2015/0325581 A1 Nov. 12, 2015

Related U.S. Application Data

(62) Division of application No. 14/194,345, filed on Feb. 28, 2014, now abandoned.

(30) Foreign Application Priority Data

Mar. 1, 2013 (FR) ...................... 13 51837

(51) Int. Cl.
| | |
|---|---|
| *H01L 29/66* | (2006.01) |
| *H01L 21/8234* | (2006.01) |
| *H01L 29/49* | (2006.01) |
| *H01L 21/265* | (2006.01) |
| *H01L 27/108* | (2006.01) |
| *H01L 27/1157* | (2017.01) |

(Continued)

(52) U.S. Cl.
CPC ............... *H01L 21/823468* (2013.01); *H01L 21/26513* (2013.01); *H01L 21/28273* (2013.01); *H01L 21/823425* (2013.01); *H01L 21/823443* (2013.01); *H01L 27/108* (2013.01); *H01L 27/10802* (2013.01); *H01L 27/1157* (2013.01); *H01L 27/11524* (2013.01); *H01L 27/11556* (2013.01); *H01L 29/4236* (2013.01); *H01L 29/4975* (2013.01); *H01L 29/6656* (2013.01); *H01L 29/66613* (2013.01); *H01L 29/66825* (2013.01); *H01L 29/772* (2013.01); *H01L 29/7881* (2013.01)

(58) Field of Classification Search
CPC ............ H01L 27/108; H01L 27/10802; H01L 29/772; H01L 27/1157
USPC ................................. 257/330; 438/270, 272
See application file for complete search history.

(56) References Cited

U.S. PATENT DOCUMENTS 5,016,067 A * 5/1991 Mori ................... H01L 29/0847
257/330
2002/0153546 A1 10/2002 Verhaar
(Continued)

*Primary Examiner* — Jamie C Niesz
(74) *Attorney, Agent, or Firm* — Seed IP Law Group LLP

(57) ABSTRACT

An integrated circuit is formed on a semiconductor substrate and includes a trench conductor and a first transistor formed on the surface of the substrate. The transistor includes: a transistor gate structure, a first doped region extending in the substrate between a first edge of the gate structure and an upper edge of the trench conductor, and a first spacer formed on the first edge of the gate structure and above the first doped region. The first spacer completely covers the first doped region and a silicide is present on the trench conductor but is not present on the surface of the first doped region.

20 Claims, 6 Drawing Sheets

(51) Int. Cl.
*H01L 29/772* (2006.01)
*H01L 21/28* (2006.01)
*H01L 29/423* (2006.01)
*H01L 29/788* (2006.01)
*H01L 27/11524* (2017.01)
*H01L 27/11556* (2017.01)

(56) References Cited

U.S. PATENT DOCUMENTS

| | | | |
|---|---|---|---|
| 2009/0003074 A1* | 1/2009 | Georgescu | G11C 16/0433 365/185.18 |
| 2009/0158226 A1 | 6/2009 | Ho et al. | |

* cited by examiner

INTEGRATED CIRCUIT PROTECTED FROM SHORT CIRCUITS CAUSED BY SILICIDE

BACKGROUND

Technical Field

The present disclosure relates to an integrated circuit protected from short circuits caused by silicide, and to a method of fabricating such an integrated circuit.

Detailed Description

FIG. 1 is a cross-sectional view of an integrated circuit IC comprising a pair of memory cells C1, C2. Each memory cell C1, C2 comprises a floating gate transistor FGT1, FGT2 and a selection transistor ST1, ST2 respectively in series. The integrated circuit is formed in/on a substrate comprising a P-type doped well PW of a semiconductor wafer WF. The well PW is isolated from the rest of the wafer WF by an N-doped isolation layer NISO that surrounds the entire well.

A trench 1 extends from the surface of the well PW to the isolation layer NISO. The sidewalls and bottom of the trench 1 are covered by an isolating layer 2 (such as oxide) and the remaining volume of the trench is filled with a semiconductor material 3, such as polycrystalline silicon or "polysilicon". Together, the trench 1, isolating layer 2, and conductive material 3 form a trench conductor CT.

The floating gate transistors FGT1, FGT2 are formed on opposite sides of the trench conductor CT, on the surface of the substrate. Each floating gate transistor comprises a first doped region R1, a second doped region R2, a horizontal channel CH1, a transistor gate structure TGS, and spacers SP1, SP2.

Regions R1, R2 are N-type doped and respectively comprise shallow lightly doped portions n1, n2 and deeper higher doped portions n1', n2' respectively. The first region R1 extends in the well PW from a first edge E1 of the transistor gate structure to the upper edge of the trench conductor CT, and forms the transistor source region (S). The second region R2 extends in the well PW from a second edge E2, opposite the first, of the transistor gate structure to an edge of a transistor gate structure of an adjacent memory cell (not shown), and forms the transistor drain region (D). The channel CH1 extends in the well PW between the regions R1, R2 and has a length L1.

The transistor gate structure TGS is formed above the channel CH1 and comprises a stack of a first oxide layer O1 (tunnel oxide), a first polycrystalline silicon layer P1 (floating gate FG), a second oxide layer O2 (gate oxide), and a second polycrystalline layer P2 (control gate CG). The first spacer SP1 is formed on the first edge E1 of the gate structure TGS above the first doped region R1, and the second spacer SP2 is formed on the second edge E2 of the gate structure above the second doped region R2.

The selection transistors ST1, ST2 each comprise the first doped region R1, a third doped region R3, the trench conductor CT, and a vertical channel CH2. The region R3 is N-type doped and formed in the layer NISO. Regions R1, R3 respectively form the transistor drain (D) and source (S) regions of the selection transistors. The semiconductor material 3 of the trench conductor CT forms a "buried" or "vertical" select gate SG that is common to both selection transistors ST1, ST2, with the isolating layer 2 forming a gate oxide. The channels CH2 extend in the well PW between the regions R1, R3, on opposite sides of the trench conductor CT, and have a length L2.

Silicides SI are formed on the top surfaces of the doped regions R1, R2, the semiconductor material 3 of the trench conductor CT, and the control gates CG. A dielectric isolating material (not shown for the sake of clarity) covers the memory cells C1, C2. The doped regions R2 of transistors FGT1, FGT2 are coupled to a metal track M1 formed in a first metal layer or "metal1" by means of a contact CN traversing the dielectric isolating material.

The metal track M1 serves as a bitline, the layer NISO serves as a source line, and the trench conductor CT serves as a wordline. Another contact (not shown) may be made to the semiconductor material 3 of the trench conductor for the application of wordline voltages. Additional pairs of memory cells extend to the left and the right of the figure, and are coupled to the same bitline and to different wordlines.

Shallow trench isolations or STI (not shown) may be formed parallel to the plane of the figure, on opposite sides of the memory cells. These isolations separate columns of memory cells linked to adjacent bitlines. Each memory cell C1, C2 thus has a width (not shown) defined by the width of the doped regions plus two times half the distance of each shallow trench isolation.

Each memory cell C1, C2 has a length defined by distances D1 to D5. Distance D1 corresponds to the distance from the first edge E1 of the transistor gate structure TGS to the upper edge of the trench conductor CT, distance D2 corresponds to the distance from the second edge E2 of the transistor gate structure TGS to the edge of the contact CN, distance D3 corresponds to half the width of the trench conductor CT, distance D4 corresponds to the length of the transistor gate structure TGS from edge to edge, and distance D5 corresponds to half the width of the contact CN.

As a numerical example, for a semiconductor fabrication technology of 90 nm, distances D1=D2=75 nm, D3=75 nm, D4=100 nm, and D5=45 nm for a total cell length of 370 nm. The width of each cell is equal to 260 nm, for a total cell size of 0.96 micrometers squared.

A memory cell comprising a buried vertical gate thus provides a smaller surface area as compared to a conventional memory cell, wherein both the floating gate transistor and the selection transistor are formed on the surface of the substrate for a cell length of 715 nanometers. For a same width of 260 nm, the cell size is 0.18 micrometers squared for the same semiconductor fabrication technology.

Silicidation is commonly performed by a "self-aligned" silicide or "salicide" process in order to reduce resistance of the silicided areas R1, R2, CG, CT. Nevertheless, there is a high risk that a silicide short circuit or "bridge" will form above the isolating layer 2 between the doped regions R1 and the semiconductor material 3, in the encircled zones. This risk mainly arises due to the thin dimension, for example 10 nm or less, of the isolating layer 2. Such a silicide short disrupts the operation of the memory cell.

One solution to prevent such silicide shorts is to mask the doped region R1 and the semiconductor material 3, such that no silicide forms on these surfaces. Consequently, only the doped regions R2 and the control gates CG are silicided. Nevertheless, this method requires an additional mask and processing steps, and leaves the doped region R1 and the semiconductor material 3 un-silicided. Accordingly, contacts cannot be made to the trench conductor CT between the memory cells C1, C2 and must be placed at the exterior of an array of memory cells. Further, the resistance of the semiconductor material 3 is greatly increased, such that the total length of the trench conductor is reduced.

Another solution is to form a silicidation protection feature covering only the encircled zone of the junction between the doped region R1, the isolating layer 2, and the semiconductor material 3. However, this method also requires additional masks and processing steps, and may be difficult to implement due to minimum feature sizes and proper alignment.

Yet another solution is to silicide the top surface of the semiconductor material 3 before forming the floating gate transistors. Nevertheless, the silicidation process is generally performed during the "back end of line" processing, once the transistors have been completed, in order to avoid contamination of the transistors.

BRIEF SUMMARY

It may therefore be desired to provide an alternative method for preventing a silicide short circuit between two semiconductor regions.

Embodiments of the disclosure relate to an integrated circuit formed on a semiconductor substrate and comprising a trench conductor and a first transistor formed on the surface of the substrate. The trench conductor comprises a trench formed in the substrate, an isolating layer on at least the sidewalls of the trench, and a semiconductor material filling the trench. The transistor comprises: a transistor gate structure; a first doped region extending in the substrate between a first edge of the gate structure and an upper edge of the trench conductor; and a first spacer formed on the first edge of the gate structure and above the first doped region. According to one embodiment, the first spacer completely covers the first doped region and a silicide is present on the surface of the semiconductor material of the trench conductor but is not present on the surface of the first doped region.

According to one embodiment, the integrated circuit further comprises a second doped region extending in the substrate from a second edge, opposite of the first, of the gate structure; and a second spacer formed on the second edge of the gate structure and above the second doped region.

According to one embodiment, the trench conductor forms a buried gate of a second transistor, and the integrated circuit further comprises a third doped region that extends along lower edges of the buried gate and forms a source or drain region of the second transistor, such that the second transistor has a vertical channel extending on one side of the buried gate, between the first and the third doped regions.

According to one embodiment, the first transistor is a charge storage transistor and the second transistor is a selection transistor, the transistors forming a first memory cell.

According to one embodiment, the integrated circuit further comprises a second memory cell comprising a charge storage transistor formed on the surface of the substrate on the opposite side of the trench conductor and a selection transistor comprising a vertical channel extending on an opposite side of the trench conductor, the trench conductor forming a common buried gate of the first and second memory cells.

According to one embodiment, a first distance between the first edge of the transistor gate structure and the upper edge of the trench conductor is approximately half a second distance between the second edge of the transistor gate structure and a contact formed to the second doped region.

According to one embodiment, the first spacer has a length greater than or equal to the first distance, and the second spacer has approximately the same length as the first spacer.

According to one embodiment, a first distance between the first edge of the transistor gate structure and the upper edge of the trench conductor is approximately equal a second distance between the second edge of the transistor gate structure and a contact formed to the second doped region.

According to one embodiment, the first spacer is approximately twice as long as the second spacer.

According to one embodiment, the first spacer is a double-spacer structure comprising a first portion that partially covers the first doped region and a second portion that covers the remainder of the first doped region.

According to one embodiment, the second doped region comprises a shallow, lightly doped portion and a deeper, more highly doped portion, and the first doped region only comprises a shallow, lightly doped portion.

According to one embodiment, a silicide is also present on at least one of the control gate and the second doped region.

Embodiments of the disclosure also relate to a device comprising an integrated circuit according to one embodiment.

Embodiments of the disclosure also relate to a method of fabricating an integrated circuit on a semiconductor substrate comprising the steps of: forming at least one trench in the substrate; forming an isolating layer on at least the sidewalls of the trench; filling the trench with a semiconductor material to form a trench conductor; forming a first transistor gate structure on the surface of the substrate; implanting a first doped region extending between a first edge of the gate structure and an upper edge of the trench conductor; forming a first spacer on the first edge of the gate structure and above the first doped region, wherein the first spacer completely covers the first doped region and prevents it from being silicided; and forming a silicide on the top surface of the semiconductor material of the trench conductor but not on the surface of the first doped region.

According to one embodiment, the method further comprises implanting a second doped region extending from a second edge, opposite of the first, of the gate structure; and forming a second spacer on the second edge of the gate structure and above the second doped region.

According to one embodiment, the trench conductor is a buried gate of a second transistor, the method further comprising the step of forming a third doped region extending along lower edges of the buried gate and forming a source or drain region of the second transistor, such that the second transistor has a vertical channel extending on one side of the buried gate, between the first and the third doped regions.

According to one embodiment, the steps of forming the spacers further comprise: forming a first spacer above the first doped region and a second spacer above the second region, wherein the first spacer only partially covers the first doped region; removing the second spacer; forming an additional first spacer covering the remainder of the first doped region; and forming an additional second spacer above the second doped region.

According to one embodiment, the step of forming the spacers comprises: depositing a uniform spacer layer; and patterning and etching the uniform spacer layer in order to form the first and second spacers.

According to one embodiment, the method further comprises a step of implanting dopants into the second doped region, without implanting dopants into the first doped region.

BRIEF DESCRIPTION OF THE SEVERAL
VIEWS OF THE DRAWINGS

Embodiments of an integrated circuit and a method of fabricating such an integrated circuit according to the disclosure will be described in the following in a non-limiting manner, in relation with the appended drawings in which:

FIG. 1, previously described, is a cross-sectional view of a conventional integrated circuit, FIG. 2 is a cross-sectional view of an integrated circuit according to a first embodiment of the disclosure, FIGS. 3A to 3F are cross-sectional views of steps of a method of fabrication of an integrated circuit according to the first embodiment of the disclosure, FIG. 4 is a cross-sectional view of an integrated circuit according to a second embodiment of the disclosure, FIGS. 5A to 5D are cross-sectional views of steps of a method of fabrication of an integrated circuit according to the second embodiment of the disclosure, FIG. 6 is a cross-sectional view of an integrated circuit according to a third embodiment of the disclosure, FIGS. 7A and 7B are cross-sectional views of steps of a method of fabrication of an integrated circuit according to the third embodiment of the disclosure, and FIG. 8 shows a device comprising an integrated circuit according to an embodiment of the disclosure.

DETAILED DESCRIPTION

The disclosure is based on the following mutually independent observations about the first doped regions R1 of the integrated circuit shown in FIG. 1: the length of the doped region R1 may be reduced without adverse effects on the operation of the transistors; a second implantation of dopants to form the deeper higher doped portions n1' is not necessary; and it is not necessary to silicide the doped regions R1 as they are relatively small and no contact is made thereto.

FIG. 2 is a cross-sectional view of an integrated circuit IC1 according to a first embodiment of the disclosure. The integrated circuit IC1 comprises a pair of memory cells C11, C12, each comprising a floating gate transistor FGT11, FGT12 and a selection transistor ST11, ST12 respectively. The structure of the memory cells C11, C12 is similar to that of memory cells C1, C2, described in relation with FIG. 1, with same references designating the same features.

The integrated circuit IC1 shown in FIG. 2 differs from the integrated circuit IC shown in FIG. 1 in that the distance between the first edge E1 of the transistor gate structure TGS and the upper edge of the trench conductor CT and has been reduced to a distance D1'. In particular, the layout parameters are adjusted during the conception of the integrated circuit IC1 such that the distance D1' is equal to the width of the first spacer SP1 to be formed above the first doped region R1.

Consequently, the spacers SP1 completely cover the doped regions R1, thereby preventing a silicide from forming on the doped regions R1; consequently, a silicide short circuit cannot form between the doped region R1 and the semiconductor material 3 of the trench conductor CT. Furthermore, silicides SI may still form on the semiconductor material 3, control gates CG, and the second doped regions R2. Bitline and wordline contacts (not shown) may be made as desired to the doped region R2 and to the trench conductor CT, and no additional masks or process steps are required. The distances D2, D3, D4, and D5 (not shown in FIG. 2) are not modified but the overall cell size is further reduced with respect to that shown in FIG. 1. As a numerical example, D1'=75/2 nm, D2=75 nm, D3=75 nm, D4=100 nm, D5=45 nm, for a total length of 332.5 nm, and a same width of 260 nm, for a cell size of 0.86 microns squared.

Additionally, as the spacers SP1 completely cover the doped regions R1, deeper higher doped portions (n1' of FIG. 1) are not formed in the first doped regions R1. Consequently, the doped regions R1 only comprise a shallow lightly doped portion n1, whereas the doped regions R2 comprise both a shallow lightly doped portion n2 and a deeper higher doped portion n2'. As a result, the vertical channels CH2 between regions R1, R3 of the selection transistors ST11, ST12 have increased channel lengths L2'. The increased channel length L2' of the selection transistors helps prevent "punchthrough" due to parasitic current paths between the drain region R1 and the source region R3 of the selection transistors.

Furthermore, in this embodiment, the first spacer SP1 and the second spacer SP2 are approximately the same length, within the variances of conventional semiconductor manufacturing procedures, for example ±5%, and the first distance D1' is approximately half the distance D2.

FIGS. 3A to 3E show cross-sectional views of steps of a method of fabrication of the integrated circuit IC1 according to the first embodiment of the disclosure.

FIG. 3A shows preliminary steps S1, comprising:
implanting the N-doped isolation layer NISO in the wafer WF to delimit the P-type well PW;
forming the doped region R3 (not shown in the following figures) in the layer NISO;
implanting (optional) a P-doped layer in the well PW, above the layer NISO, to adjust the threshold voltages of the selection transistors ST11, ST12;
etching the trenches 1 from the top surface of the substrate sufficiently deep to reach the layer NISO;
depositing the isolating layer 2 on the sidewalls and bottom of the trenches 1;
filling the trenches 1 with the semiconductor material 3, such as a first polycrystalline silicon or "poly1" layer;
forming the tunnel oxides on the surface of the substrate PW by depositing and etching the first oxide layer O1, for example of the silicon dioxide $SiO_2$ type;
forming the floating gates FG above the tunnel oxides by depositing and etching the first polycrystalline silicon or "poly1" layer P1;
forming the gate oxides above the floating gates FG by depositing and etching the second oxide layer O2, for example of the ONO (Oxide-Nitride-Oxide) type; and
forming the control gates CG above the gate oxides by depositing and etching the second polycrystalline silicon or "poly2" layer P2.

It will be understood by the skilled person that several of these steps may be performed in a different order or conjointly according to conventional semiconductor fabrication methods, such as the etching of more than one layer at a time.

FIG. 3B shows a step S2, wherein a first implantation of N-type dopants into the top surface of the wafer WF is performed. The first doped regions R1 are formed between the edges of the transistor gate structure TGS and the upper edges of the trench conductor CT, and the second doped regions R2 are formed between the edges of adjacent transistor gate structures without a trench conductor therebetween. Regions R1, R2 each comprise shallow lightly doped portions.

Figure 3A:
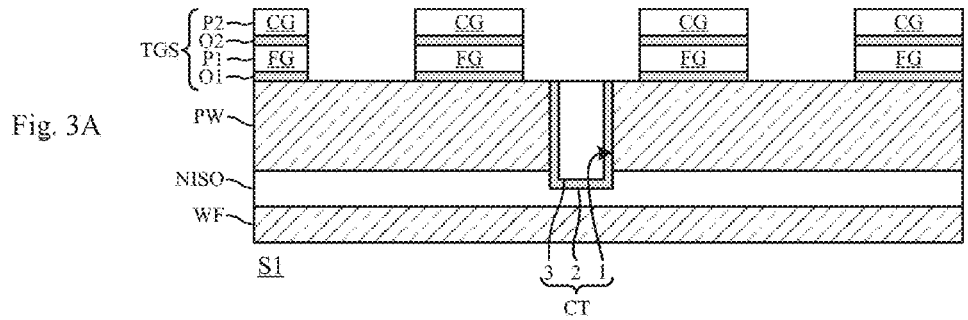
FIG. 3C shows a step S3, wherein a spacer layer SL1, such as silicon dioxide SiO2, is deposited in a conformal manner on the top surface of the wafer WF. The spacer layer SL1 covers the transistor gate structures TGS, the doped regions R1, R2, and the trench conductors CT.
FIG. 3D shows a step S4, wherein the spacer layer SL1 is etched by means of an anisotropic process to form the spacers SP1, SP2 on the edges of the transistor gate structures TGS. It may be noted in FIG. 3D that the spacers SP1 completely cover the doped regions R1, whereas the spacers SP2 do not completely cover the doped regions R2, thus allowing a second implantation of the doped regions R2.
Figure 3B:
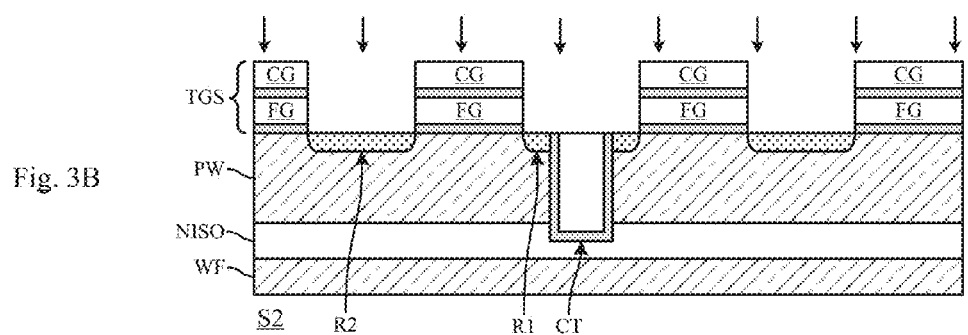
Figure 3C:
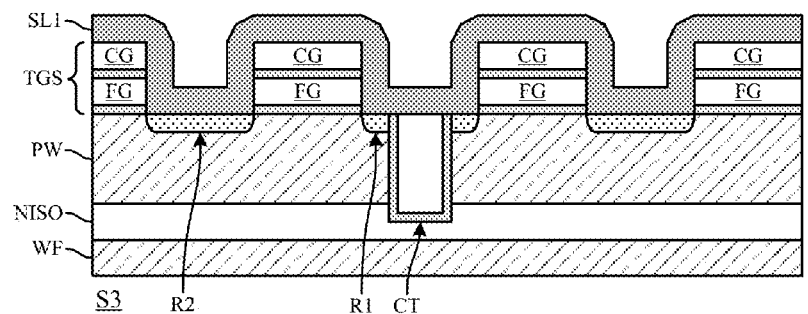
Figure 3D:
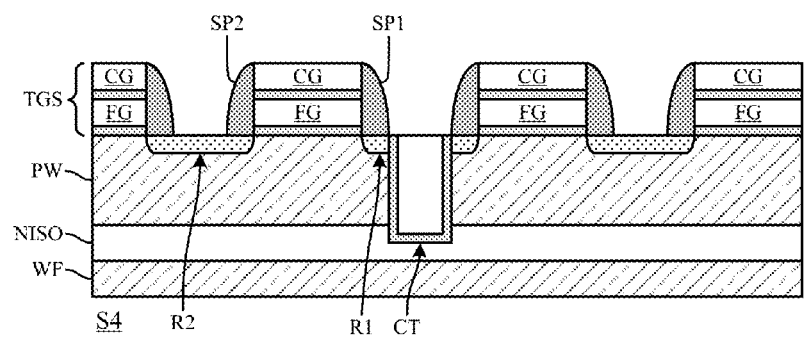
Figure 3E:
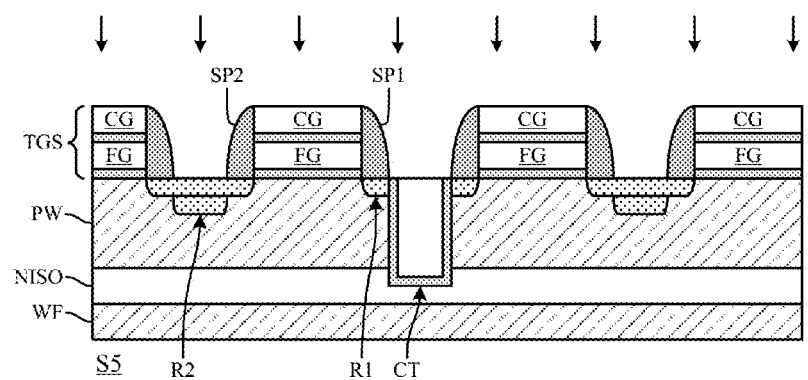

FIG. 3E shows a step S5, wherein a second implantation of N-type dopants into the top surface of the wafer is performed. The second doped regions R2 now further comprise a deeper higher doped portion. The first doped regions R1 are not implanted a second time, as they are covered by the spacers SP1.

Figure 3F:
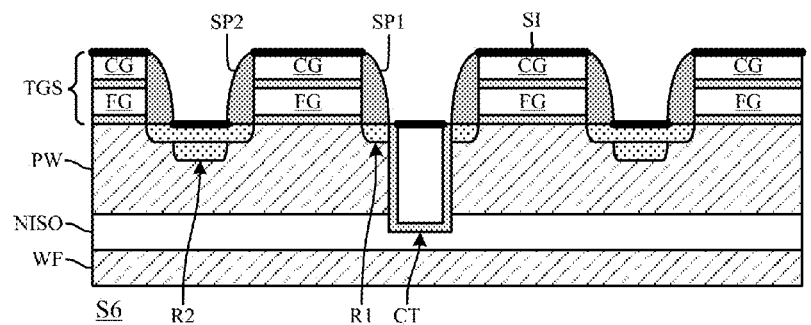

FIG. 3F shows a step S6, wherein the top surface of the wafer WF is silicided, either by direct deposition or by deposition and reaction in a self-aligned process. The surfaces of the semiconductor material 3 in the trench conductor CT, the doped regions R2, and the control gates CG are thus covered by silicide SI. It may be noted in FIG. 3F that no silicide forms on the first doped regions R1, which are protected by the spacers SP1. Thus, no silicide short occurs between the doped regions R1 and the semiconductor material 3 of the trench conductor CT.

Figure 1:
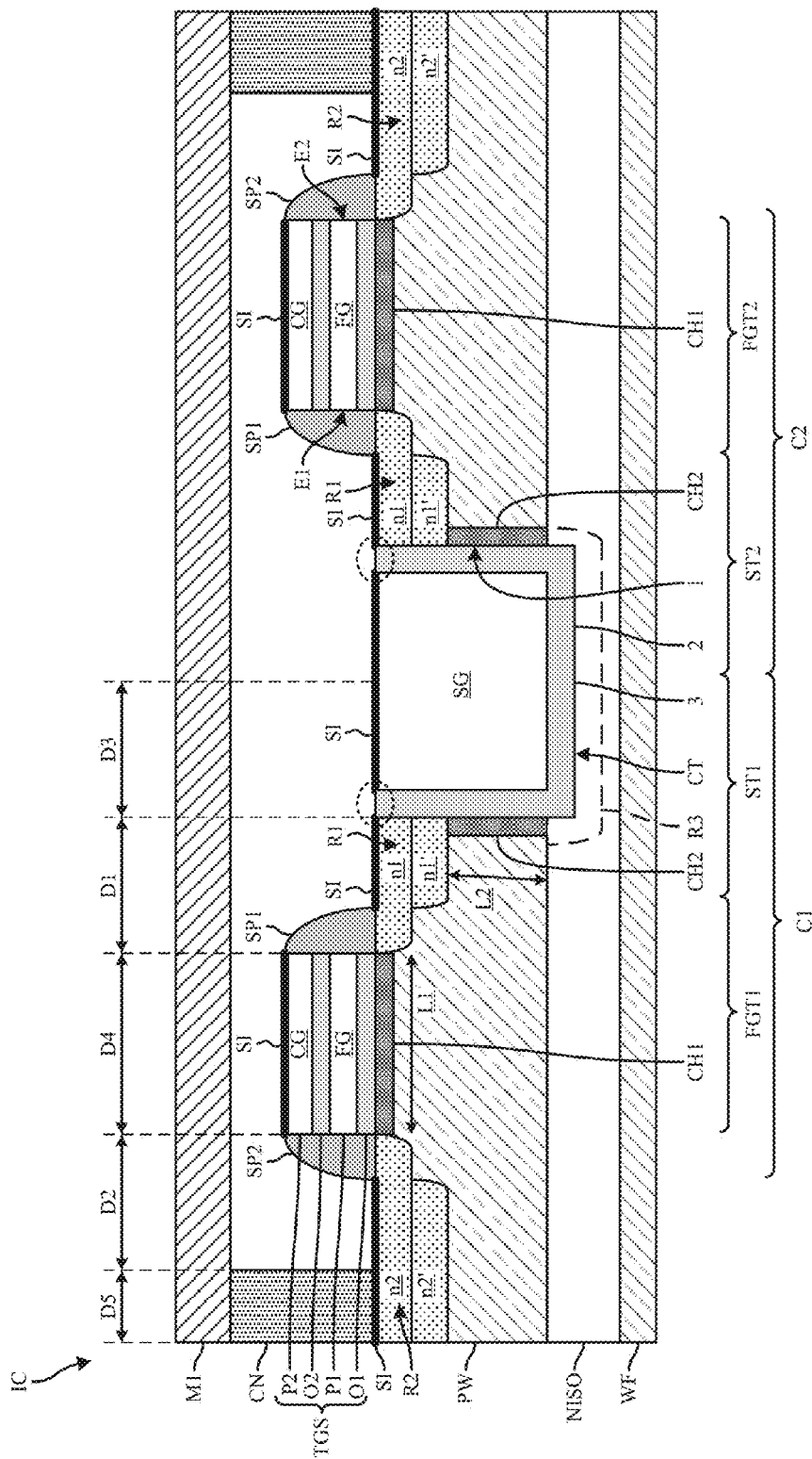
Figure 4:
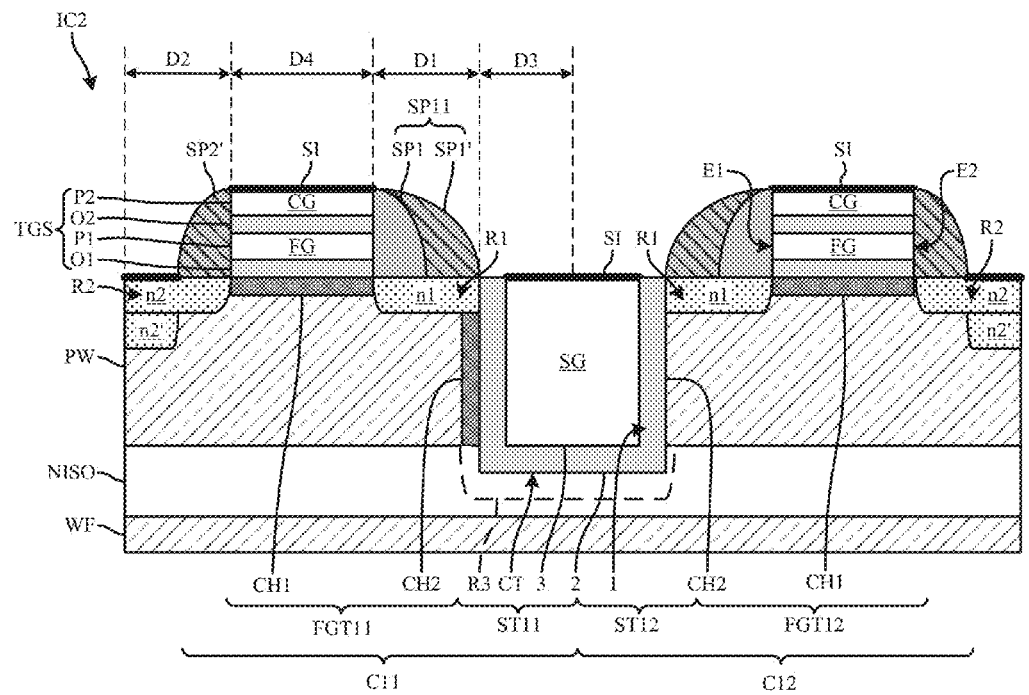

FIG. 4 is a cross-sectional view of an integrated circuit IC2 according to a second embodiment of the disclosure. The integrated circuit IC2 comprises a pair of memory cells C11, C12, each comprising a floating gate transistor FGT11, FGT12 and a selection transistor ST11, ST12 respectively. The structure of the memory cells C11, C12 is similar to that of memory cells C1, C2, described in relation with FIG. 1, with same references designating the same features.

Figure 2:
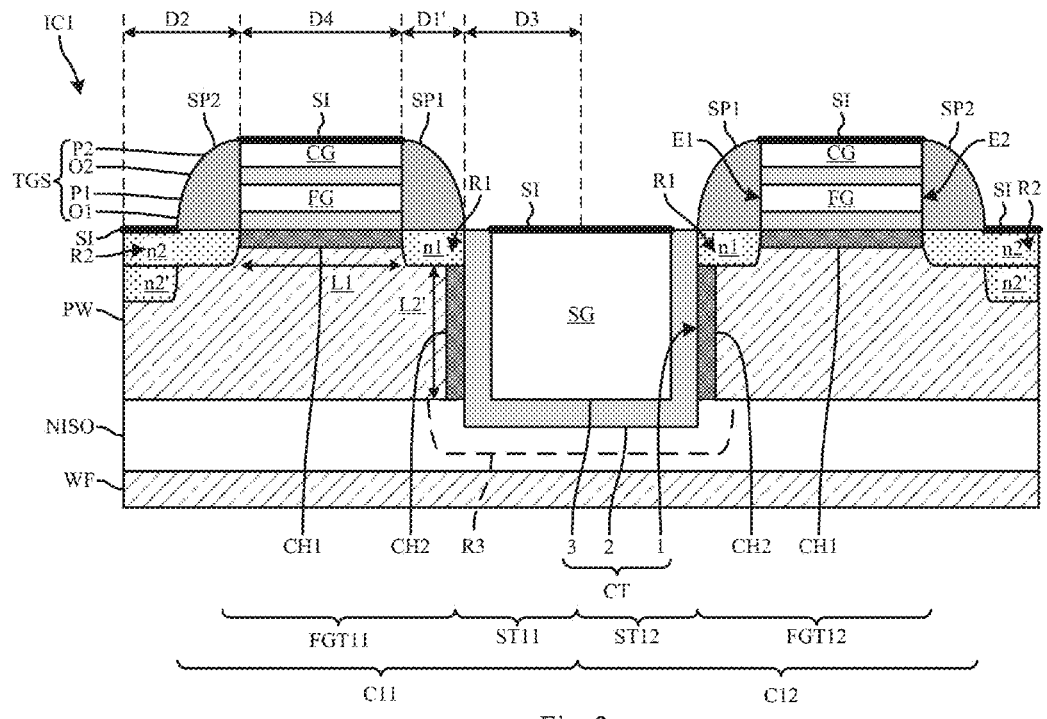

Integrated circuit IC2 differs from the integrated circuit IC1 shown in FIG. 2 in that rather than the distance between the first edge E1 of the transistor gate structure TGS and the edge of the trench conductor CT being reduced to the size of a spacer, the size of the spacer is increased to the distance between the first edge E1 of the transistor gate structure TGS and the edge of the trench conductor CT. Thus, a large first spacer SP11 is formed that completely covers the first doped region R1. The spacer SP11 is of the "double-spacer" type, and comprises a first spacer SP1 that only partially covers the first doped region R1, for example half of the distance D1, and an additional spacer SP1' that covers the remainder of the first doped region R1, that is to say, from the outer edge of the first spacer SP1 to the edge of the doped region. A second spacer SP2' is formed above the second doped region R2. Consequently, in this embodiment, distance D1=D2, and the other distances D3, D4, and D5 (not shown in FIG. 4) are not modified.

FIGS. 5A to 5D show cross-sectional views of steps of a method of fabrication of the integrated circuit IC2 according to the second embodiment of the disclosure. Prior to the step shown in FIG. 5A, the fabrication steps S1 to S4 as shown and described in relation with FIGS. 3A to 3D were performed, with the exception that the spacer SP1 only partially covers the doped region R1.

Figure 5A:
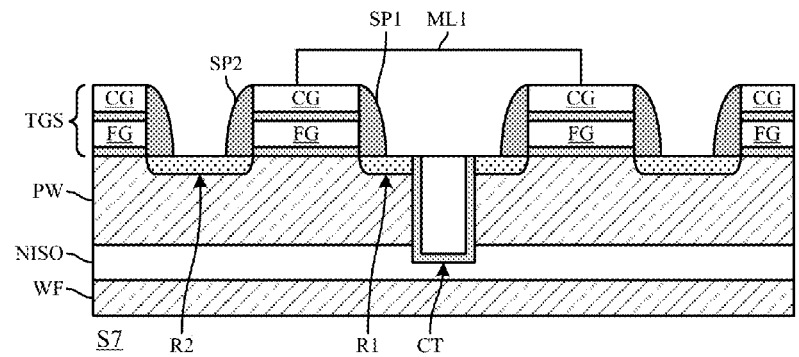

FIG. 5A shows a step S7, wherein a mask layer ML1 is deposited over the top surface of the wafer WF. The mask layer ML1 is then patterned to expose the spacers SP2 and to cover the spacers SP1.

Figure 5B:
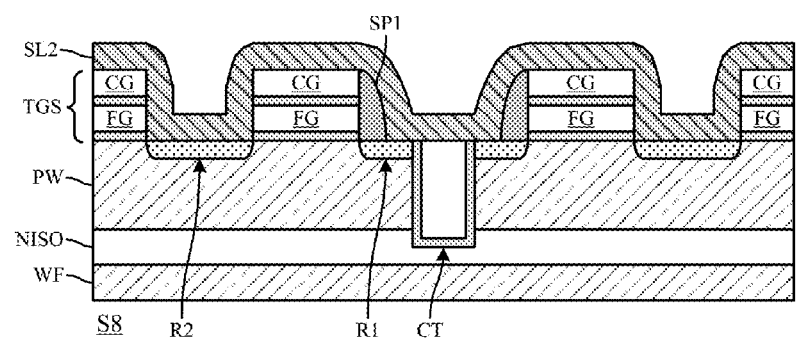

FIG. 5B shows a step S8, wherein the spacers SP2 are removed, then the mask layer ML1 is removed. The first spacers SP1 remain, partially covering the first doped regions R1. A spacer layer SL2, such as silicon dioxide SiO2, is then deposited in a conformal manner on the top surface of the wafer WF, covering the transistor gate structures TGS, the spacers SP1, the doped regions R1, R2, and the trench conductors CT.

Figure 5C:
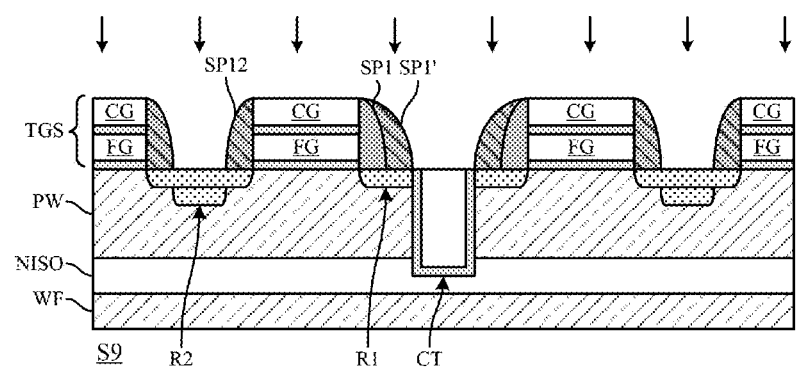

FIG. 5C shows a step S9, wherein the spacer layer SL2 is etched in an anisotropic manner, forming the additional spacers SP1', SP2'. The spacer SP1' extends from the edge of the first spacer SP1 to the edge of the first doped region R1, such that the doped region R1 is completely covered by the double-spacer structure SP1, SP1'. The second spacer SP2' extends from the second edge of the transistor gate structure above the second doped region R2. A second dopant implantation is then performed, wherein dopants implanted in the second doped region R2 are self-aligned with the edges of the second spacers SP2'. The first doped regions R1 are protected from a second implantation by the double spacer structure SP1, SP1'. It may be noted that if it is nevertheless desired to form a deeper highly doped portion of region R1, the second implantation may be performed before the step shown in FIG. 5A, in order to implant both regions R1, R2.

Figure 5D:
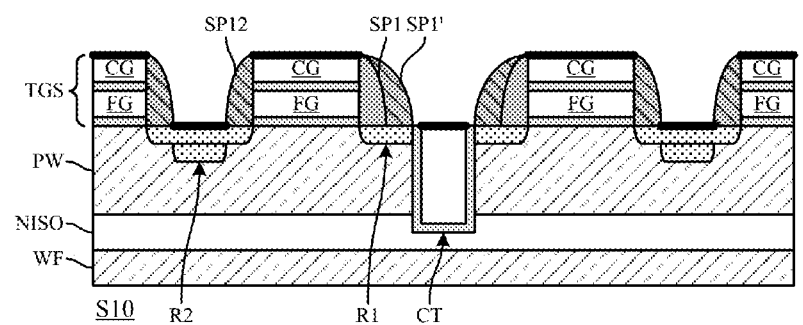

FIG. 5D shows a step S10, wherein the top surface of the wafer WF is silicided, either by direct deposition or by deposition and reaction in a self-aligned process. The surfaces of the semiconductor material 3 in the trench conductor CT, the doped regions R2, and the control gates CG are thus covered by silicide SI. It may be noted in FIG. 5D that no silicide forms on the first doped regions R1, which are protected by the first spacers. Thus, no silicide short occurs between the doped regions R1 and the semiconductor material 3 of the trench conductor CT.

Figure 6:
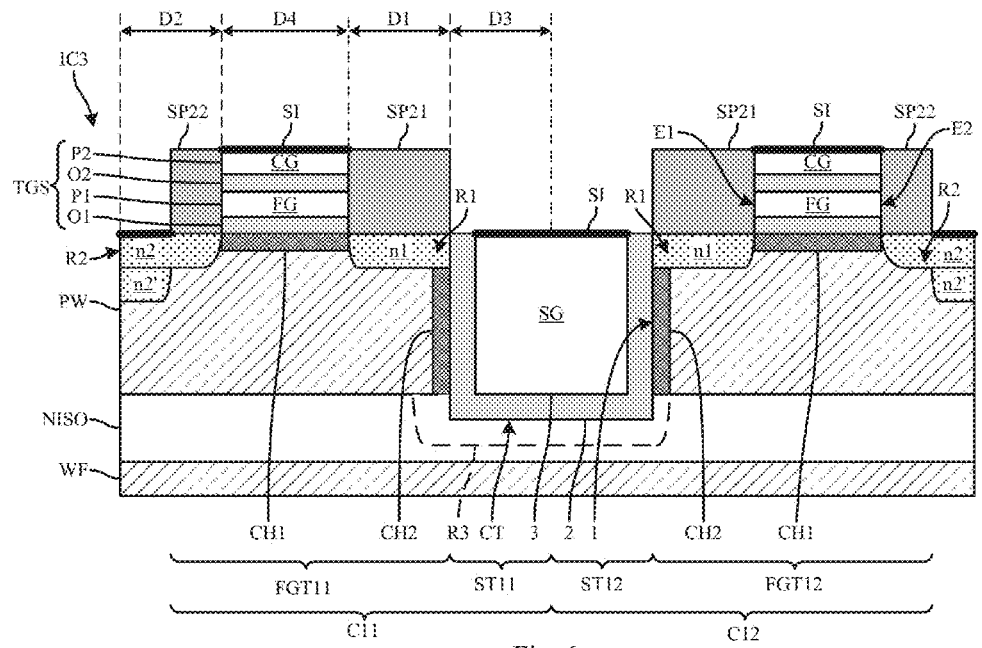

FIG. 6 is a cross-sectional view of an integrated circuit IC3 according to a third embodiment of the disclosure. The integrated circuit IC3 comprises a pair of memory cells C11, C12, each comprising a floating gate transistor FGT11, FGT12 and a selection transistor ST11, ST12 respectively. The structure of the memory cells C11, C12 is similar to that of memory cells C1, C2, described in relation with FIG. 1, with same references designating the same features.

Integrated circuit IC3 differs from the integrated circuit IC1 shown in FIG. 2 in that rather than the distance between the first edge E1 of the transistor gate structure TGS and the edge of the trench conductor CT being reduced, a large first spacer SP21 is formed that completely covers the first doped region R1. A spacer SP22 is formed on the opposite side, partially covering the second doped region R2 such that a second implantation of dopants may be performed in doped region R2. Spacer SP21 is significantly longer than spacer SP22, for example twice as long. Consequently, in this embodiment, distance D1=D2, and the other distances D3, D4, and D5 (not shown in FIG. 6) are not modified.

Figure 7A:
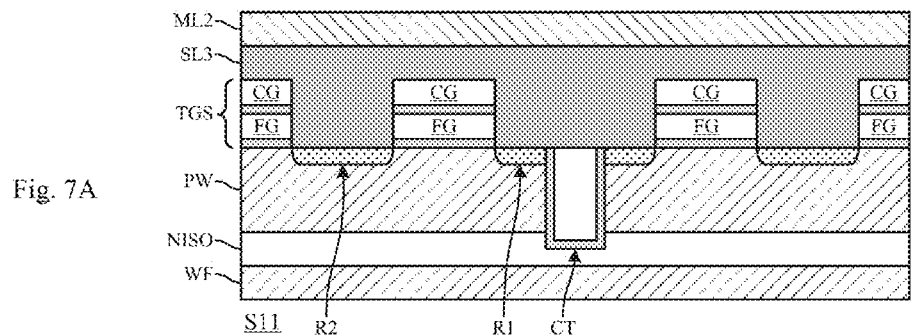
Figure 7B:
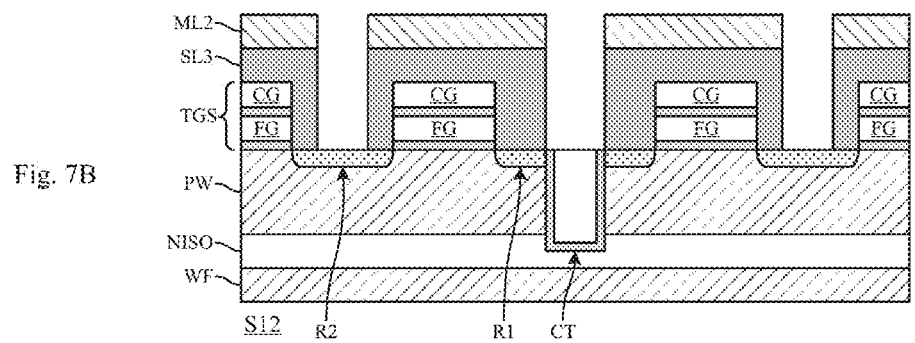

FIGS. 7A and 7B show cross-sectional views of steps of fabricating an integrated circuit IC3 according to the third embodiment of the disclosure. Prior to the step shown in FIG. 7A, the fabrication steps S1 and S2 as shown and described in relation with FIGS. 3A and 3B were performed.

FIG. 7A shows a step S11, wherein a spacer layer SL3 is deposited in a uniform manner over the top surface of the wafer WF, covering the transistor gate structures TGS, the doped regions R1, R2, and the trench conductors CT. A mask layer ML2 is then deposited over the spacer layer SL3.

FIG. 7B shows a step S12, wherein the mask layer ML2 is patterned and etched, followed by an etching of the spacer layer SL3. The mask layer ML2 is then removed and the spacer layer material SL3 extending above the transistor gate structures is removed. The second implantation of dopants in the doped regions R2 is then performed, followed by silicidation of the wafer.

Figure 8:
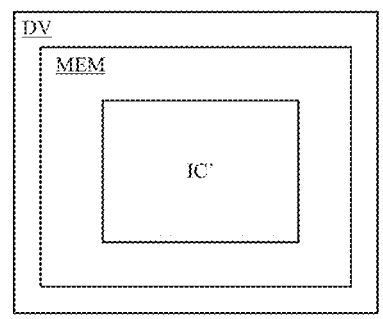

FIG. 8 shows an application example of a device DV according to embodiments of the disclosure. The device DV comprises a memory MEM, which in turn comprises an integrated circuit IC' (IC1, IC2, IC3) according to an embodiment of the disclosure. The device DV may further comprise a processor and a communication interface circuit. The device may be a portable device such as a mobile telephone, a chipcard, etc.

Although the disclosure has been described in relation with a pair of memory cells C11, C12, each comprising a floating gate transistor and a selection transistor, wherein the selection transistors comprise a common buried gate, the disclosure is not limited to such an application. The disclosure is indeed applicable to a memory cell comprising a selection transistor not having its buried gate in common with that of another selection transistor. The disclosure is further applicable to any transistor formed adjacent to a trench conductor, with a thin oxide layer separating a doped region of the transistor and a semiconductor material of the trench, wherein a risk of a silicide short exists between the doped region and the semiconductor material.

It will be understood that the length of the spacer SP1, SP11, SP21 formed above the first doped region R1 is equal to or greater than the distance D1, D1' between the first edge E1 of the transistor gate structure TGS and the upper edge of the trench conductor CT. In particular, the outer edge of the first spacer SP1, SP11, SP21 may extend beyond the junction of the doped region R1 and the trench conductor CT such that it slightly overlaps the isolating layer 2 or the semiconductor material 3. This may be the unavoidable result of the spacer formation process, or deliberate to ensure that the doped region R1 is completely covered despite any variances of the semiconductor fabrication process.

Furthermore, though the disclosure has been described in relation with N-type doped regions R1, R2, R3, NISO, and a P-type doped well PW, it is equally applicable to P-type doped regions R1, R2, R3, a P-doped isolation layer, and an N-type doped well. Additionally, though the transistors formed on the surface of the substrate have been described as floating gate or "charge storage" transistors, they may instead simply comprise a control gate and a gate oxide, or comprise for example silicon nanocrystals instead of a floating gate of polysilicon material.

It will also be understood that the doped regions R1, R2 may extend slightly beneath the transistor gate structure TGS rather than stopping exactly at the edge of the gate structure. This may be due for example to a tilted implantation process.

In one embodiment, rather than removing the spacers SP2 as shown in FIGS. 5A, 5B, spacers SP2 may be left in place over the doped region R2. Consequently, a double-spacer may be formed on both sides of the transistor gate structure.

Finally, the materials described above, such as silicon dioxide and polysilicon, may be replaced by any other material commonly implemented in semiconductor fabrication.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
a trench conductor that includes:
  a trench formed in a semiconductor substrate;
  an insulating layer on sidewalls of the trench; and
  a semiconductor material filling the trench;
a first transistor formed on a surface of the substrate, the transistor including:
  a transistor gate structure;
  a first doped region extending in the substrate between a first edge of the gate structure and an upper edge of the trench conductor; and
  a second doped region extending in the substrate from a second edge of the gate structure, the second edge being on an opposite side of the gate structure with respect to the first edge;
a first spacer formed on the first edge of the gate structure and above the first doped region, the first spacer completely covering a surface of the first doped region, extending beyond the first doped region, and overlapping the insulating layer;
a silicide layer on a surface of the semiconductor material of the trench conductor but is not present on the surface of the first doped region; and
a second spacer formed on the second edge of the gate structure and above the second doped region, wherein the first spacer has a length greater than a length of the second spacer.

2. The integrated circuit according to claim 1, wherein the first spacer is approximately twice as long as the second spacer.

3. The integrated circuit according to claim 1, wherein the first spacer is a double-spacer structure comprising a first portion that partially covers the first doped region and a second portion that covers the remainder of the first doped region.

4. The integrated circuit according to claim 1, comprising a contact formed on the second doped region and having a first end, contacting the second spacer, and a second end spaced apart from the second spacer, wherein a first distance between the first edge of the transistor gate structure and the upper edge of the trench conductor is approximately equal to a second distance between the second edge of the transistor gate structure and the second end of the contact.

5. The integrated circuit according to claim 4, wherein the length of the first spacer is greater than or equal to the first distance, and the length of the second spacer is approximately half of the length of the first spacer.

6. The integrated circuit according to claim 1, wherein the first spacer completely covers the first doped region and overlaps the insulating layer.

7. The integrated circuit according to claim 1, wherein the second doped region comprises a shallow, lightly doped portion and a deeper, more highly doped portion, and the first doped region only comprises a shallow, lightly doped portion.

8. The integrated circuit according to claim 1, wherein a silicide is also present on at least one of the gate structure and the second doped region.

9. The integrated circuit according to claim 1, comprising a second transistor that includes:
a buried gate formed by the trench conductor;
a source or drain region formed by a third doped region that extends along lower edges of the buried gate; and
a first vertical channel extending on one side of the buried gate, between the first and the third doped regions.

10. The integrated circuit according to claim 9, wherein the first transistor is a first charge storage transistor and the second transistor is a first selection transistor, the transistors forming a first memory cell.

11. The integrated circuit according to claim 10, further comprising a second memory cell comprising a second charge storage transistor formed on the surface of the substrate on the opposite side of the trench conductor and a selection transistor comprising a second vertical channel extending on an opposite side of the trench conductor with respect to the first vertical channel, the trench conductor forming a common buried gate of the first and second memory cells.

12. A device comprising:
a memory including a memory cell that includes:
a selection transistor that includes a trench conductor that includes:
a trench formed in a semiconductor substrate;
an insulating layer on sidewalls of the trench; and
a semiconductor material filling the trench;
a storage transistor formed on a surface of the substrate, the storage transistor including:
a transistor gate structure;
a first doped region extending in the substrate between a first edge of the gate structure and an upper edge of the trench conductor; and
a first spacer formed on the first edge of the gate structure and above the first doped region, the first spacer completely covering a surface the first doped region, extending beyond the first doped region, and overlapping the insulating layer;
a silicide layer on a surface of the semiconductor material of the trench conductor but is not present on the surface of the first doped region;
a second doped region extending in the substrate from a second edge of the gate structure, the second edge being on an opposite side of the gate structure with respect to the first edge; and
a second spacer formed on the second edge of the gate structure and above the second doped region, wherein the first spacer has a length greater than a length of the second spacer.

13. The device according to claim 12, wherein the integrated circuit includes a contact formed on the second doped region and having a first end, contacting the second spacer, and a second end spaced apart from the second spacer, wherein a first distance between the first edge of the transistor gate structure and the upper edge of the trench conductor is approximately equal to a second distance between the second edge of the transistor gate structure and the second end of the contact.

14. The device according to claim 12, wherein the first spacer is a double-spacer structure comprising a first portion that partially covers the first doped region and a second portion that covers a remainder of the first doped region.

15. The device according to claim 14, wherein the integrated circuit includes a second transistor the includes:
a buried gate formed by the trench conductor;
a source or drain region formed by a third doped region that extends along lower edges of the buried gate; and
a first vertical channel extending on one side of the buried gate, between the first and the third doped regions.

16. A method, comprising:
fabricating an integrated circuit, the fabricating including:
forming a trench in a semiconductor substrate;
forming an insulating layer on sidewalls of the trench;
filling the trench with a semiconductor material to form a trench conductor;
forming a first transistor gate structure on a surface of the substrate;
implanting a first doped region extending between a first edge of the gate structure and an upper edge of the trench conductor;
forming a first spacer on the first edge of the gate structure and above the first doped region, wherein the first spacer completely covers the first doped region, extends beyond the first doped region, and overlaps the insulating layer;
forming a silicide on the top surface of the semiconductor material of the trench conductor while the first spacer prevents the first doped region from being silicided;
implanting a second doped region extending from a second edge of the gate structure, the second edge being on an opposite side of the gate structure with respect to the first edge; and
forming a second spacer on the second edge of the gate structure and above the second doped region, wherein the first spacer has a length greater than a length of the second spacer.

17. The method according to claim 16, wherein the trench conductor is a buried gate of a second transistor, the fabricating including forming a third doped region extending along lower edges of the buried gate and forming a source or drain region of the second transistor, such that the second transistor has a vertical channel extending on one side of the buried gate, between the first and the third doped regions.

18. The method according to claim 17, wherein forming the first spacer includes forming a first spacer portion only partially covering the first doped region, the fabricating including:
forming the first spacer portion and a second spacer portion on either side of the gate structure, respectively;
removing the second spacer portion;
forming a third spacer portion covering a portion of the first doped region not covered by the first spacer portion to form the first spacer; and
forming a fourth spacer portion above the second doped region to form the second spacer.

19. The method according to claim 16, wherein forming the first and second spacers includes:
depositing a uniform spacer layer; and
patterning and etching the uniform spacer layer.

20. The method according to 16, wherein the fabricating includes forming a contact on the second doped region, the contact having a first end, contacting the second spacer, and a second end spaced apart from the second spacer, wherein a first distance between the first edge of the transistor gate structure and the upper edge of the trench conductor is approximately equal to a second distance between the second edge of the transistor gate structure and the second end of the contact.

* * * * *